United States Patent
Hsieh

(10) Patent No.: US 11,380,787 B2
(45) Date of Patent: Jul. 5, 2022

(54) SHIELDED GATE TRENCH MOSFET INTEGRATED WITH SUPER BARRIER RECTIFIER HAVING SHORT CHANNEL

(71) Applicant: Nami MOS CO., LTD., New Taipei (TW)

(72) Inventor: Fu-Yuan Hsieh, New Taipei (TW)

(73) Assignee: NAMI MOS CO, LTD, New Taipei (TW)

(*) Notice: Subject to any disclaimer, the term of this patent is extended or adjusted under 35 U.S.C. 154(b) by 0 days.

(21) Appl. No.: 16/869,659

(22) Filed: May 8, 2020

(65) Prior Publication Data
US 2021/0351289 A1 Nov. 11, 2021

(51) Int. Cl.
| | | |
|---|---|---|
| *H01L 29/78* | (2006.01) | |
| *H01L 29/06* | (2006.01) | |
| *H01L 29/10* | (2006.01) | |
| *H01L 29/40* | (2006.01) | |

(52) U.S. Cl.
CPC ...... *H01L 29/7805* (2013.01); *H01L 29/0634* (2013.01); *H01L 29/1095* (2013.01); *H01L 29/407* (2013.01); *H01L 29/7813* (2013.01)

(58) Field of Classification Search
CPC ............. H01L 29/7806; H01L 29/7813; H01L 29/407; H01L 29/1095; H01L 29/0634
See application file for complete search history.

(56) References Cited

U.S. PATENT DOCUMENTS

| | | | | |
|---|---|---|---|---|
| 8,274,113 B1* | 9/2012 | Hsieh | ................ | H01L 29/42372 257/334 |
| 8,816,348 B2* | 8/2014 | Hsieh | .................. | H01L 29/7806 257/66 |
| 9,716,009 B2 | 7/2017 | Kobayashi et al. | | |
| 2008/0191274 A1* | 8/2008 | Henson | ............. | H01L 29/66734 257/333 |
| 2012/0037983 A1* | 2/2012 | Hshieh | ................ | H01L 29/7827 257/334 |
| 2013/0168760 A1* | 7/2013 | Hsieh | ................ | H01L 29/42368 257/330 |
| 2013/0256786 A1* | 10/2013 | Hsieh | .................. | H01L 29/0869 257/330 |
| 2021/0126124 A1* | 4/2021 | Hsieh | .................. | H01L 29/0619 |
| 2021/0296488 A1* | 9/2021 | Hsieh | .................... | H01L 29/407 |
| 2021/0320202 A1* | 10/2021 | Hsieh | .................... | H01L 29/407 |

* cited by examiner

*Primary Examiner* — Joseph C. Nicely
(74) *Attorney, Agent, or Firm* — Bacon & Thomas, PLLC

(57) ABSTRACT

An integrated circuit comprising an SGT MOSFET and a short channel SBR is disclosed. The SBR horizontally disposed in different areas to the SGT MOSFET on single chip creates a low potential barrier for majority carrier in MOS channel for switching loss reduction. Only one additional mask is required for integration of the short channel SBR having thinner gate oxide than the SGT MOSFET. Moreover, in some preferred embodiment, an MSO structure is applied to the shielded gate structure to further reduce the on-resistance.

20 Claims, 23 Drawing Sheets

SHIELDED GATE TRENCH MOSFET INTEGRATED WITH SUPER BARRIER RECTIFIER HAVING SHORT CHANNEL

FIELD OF THE INVENTION

This invention relates generally to semiconductor devices, and more particularly, to a shielded gate trench MOSFET (Metal Oxide Semiconductor Field Effect Transistor) integrated with SBR (Super Barrier Rectifier) having short channel to achieve lower on-resistance and less switching loss.

BACKGROUND OF THE INVENTION

Please refer to FIG. 1A and FIG. 1B for two typical types of shielded gate trench MOSFET (SGT) structure, compared with traditional single gate trench MOSFETs, the shielded gate trench MOSFETs illustrated in FIG. 1A and FIG. 1B are more attractive due to the lower gate charge and on-resistance as results of existence of charge couple region in drift region and thick oxide underneath gate oxide.

To further reduce the on-resistance, a new SGT structure with multiple stepped oxide (MSO) is disclosed in U.S. Pat. No. 9,716,009 as shown in FIG. 1C, with specific on-resistance about 25% lower than the SGT MOSFETs as shown in FIG. 1A and FIG. 1B. The MSO structure has multiple small stepped oxide film and stepped single domain polycrystalline-silicon field plate in the trench, by optimizing the length and width of the steps, the MSO structure can achieve a lower on-resistance at a same breakdown voltage as the conventional field plate MOSFET.

However, the above three prior arts still encounter high Qrr (reverse recovery charge) issue as results of parasitic body diode existence, which will result in high switching loss.

Therefore, there is still a need in the art of the semiconductor device design and fabrication, particularly for SGT MOSFET design and fabrication, to provide a novel cell structure, device configuration and manufacturing process that making an SGT MOSFET have lower on-resistance and lower switching loss.

SUMMARY OF THE INVENTION

The present invention provides an SGT MOSFET integrated with a super barrier rectifier (SBR) having short channel on single chip for reducing the switching loss. The integrated SBR creates a low potential barrier for majority carrier in MOS channel, which is adjustable by gate oxide thickness, P body doping concentration and channel length. The SBR has lower forward voltage Vf and lower reverse leakage current Ir than Schottky Barrier rectifier. Moreover, the SBR has better and reliable performance at elevated temperature than the Schottky Barrier Rectifier.

According to one aspect, the invention features an integrated circuit comprising an SGT MOSFET and an SBR horizontally disposed in two different areas on single chip, further comprising: an epitaxial layer of a first conductivity type extending over a substrate of the first conductivity type, the substrate having a higher doping concentration than the epitaxial layer; the SGT MOSFET further comprising: a plurality of first type trenches formed in the epitaxial layer, each of the first type trenches being filled with a shielded electrode and a first gate electrode, the shielded electrode being insulated from the epitaxial layer by a first insulating film, the first gate electrode being insulated from the epitaxial layer by a first gate oxide film, the shielded electrode and the first gate electrode being insulated from each other; a first body region of a second conductivity type formed by a body implant having a source region of the first conductivity type thereon and surrounding the first gate electrode padded by the first gate oxide film; a first channel region formed between the first body region and the source region; the SBR further comprising: at least one second type trench formed in parallel with the first type trenches, the second type trench being filled with the shielded electrode and a second gate electrode, the shielded electrode being insulated from the epitaxial layer by the first insulating film, the second gate electrode being insulated from the epitaxial layer by a second gate oxide film, the shielded electrode and the second gate electrode being insulated from each other; the second gate oxide film having a thickness less than the first gate oxide film; a short channel implant region formed along upper sidewalls of the second type trench surrounding the second gate electrode; a second body region of the second conductivity type having the source region thereon and surrounding the second gate electrode padded by the second gate oxide film; the second body region formed into the short channel implant region by the body implant; a second channel region formed between the second body region and the source region having shorter channel length than the first channel region; the first body region, the second body region, the source region and the second gate electrode being shorted to a source metal through a plurality of trenched contacts; and oxide charge balance regions formed between adjacent of the first type trenches and the second type trenches.

According to another aspect, the present invention also features an integrated circuit further comprising: a super junction structure with a plurality of alternating P and N regions disposed above the substrate and below the oxide charge balance regions.

According to another aspect, in some preferred embodiments, the epitaxial layer comprises a single epitaxial layer having uniform doping concentration. In some preferred embodiments, the epitaxial layer comprises a lower epitaxial layer with a resistivity R1 and an upper epitaxial layer with a resistivity R2, wherein R1>R2, the first and second type trenches are penetrating through the upper epitaxial layer and extending into the lower epitaxial layer. In some other preferred embodiments, the substrate has the first conductivity type and the epitaxial layer comprises a lower epitaxial layer with resistivity R1 and an upper epitaxial layer with resistivity R2, wherein R1<R2.

According to another aspect, in some preferred embodiments, within each of the first type trenches, the shielded electrode is disposed in lower portion and the first gate electrode is disposed in upper portion, the shielded electrode and the first gate electrode are insulated from each other by a second insulating film; within the second type trench, the shielded electrode is disposed in lower portion and the second gate electrode is disposed in upper portion, the shielded electrode and the second gate electrode is insulated from each other by the second insulating film. In some other preferred embodiments, within each of the first type trenches, the shielded electrode is disposed in the middle and the first gate electrode is disposed surrounding upper portion of the shielded electrode, the shielded electrode and the first gate electrode are insulated from each other by the first gate oxide film; within the second type trench, the shielded electrode is disposed in the middle and the second gate electrode is disposed surrounding upper portion of the shielded electrode, the shielded electrode and the second gate electrode are insulated from each other by the second gate oxide.

According to another aspect, in some preferred embodiments, the first insulating film is a single oxide film having uniform thickness. In some other preferred embodiments, the first insulating film has multiple stepped oxide structure having greatest thickness along bottom of the first and second type trenches.

According to another aspect, in some preferred embodiments, the second type trench has trench width and trench depth same as the first type trenches. In some other preferred embodiments, the second type trench has trench width and trench depth greater than the first type trenches.

According to another aspect, in some preferred embodiments, the short channel implant region is formed by angle implant of Arsenic or Phosphorus through a short channel implant mask after removing the first gate oxide and before growing the second gate oxide.

The invention also features a method for manufacturing an integrated circuit comprising an SGT MOSFET and an SBR horizontally disposed in two different areas on single chip comprising the steps of: (a) growing an epitaxial layer of a first conductivity type upon a substrate of the first conductivity type, wherein the epitaxial layer has a lower doping concentration than the substrate; (b) forming a hard mask such as an oxide onto a top surface of the epitaxial layer for definition of a plurality of gate trenches; (c) forming a plurality of gate trenches, and mesas between two adjacent gate trenches in the epitaxial layer by etching through open regions in the block layer; (d) forming a thick oxide layer along inner surfaces of the gate trenches by thermal oxide growth or oxide deposition; (e) depositing a first doped poly-silicon layer filling the gate trenches to serve as shielded gate electrodes; (f) etching back the shielded gate electrodes from the top surface of the epitaxial layer; (g) etching back the thick oxide layer from the top surface of the epitaxial layer and an upper portion of the gate trenches; (h) forming another oxide layer by high density plasma oxide deposition; (i) etching back the oxide layer by Oxide CMP (Chemical Mechanical Polishing) or wet oxide etch to form the second insulation layer; (j) growing a thick gate oxide layer as the first gate oxide (GOX1) covering at least along trench sidewalls of an upper portion of each of the gate trenches; (k) forming a short channel implant region (Nsci) along upper sidewalls of the second type trench surrounding the second gate electrode; (l) growing a thinner gate oxide layer as the second gate oxide (GOX2); (m) depositing a second doped poly-silicon layer filling the upper portion of the gate trenches, followed by etching back by CMP or plasma etch to serve as gate electrodes; (n) carrying out a body implantation of the second conductivity type dopant and a step of body diffusion to form body regions; (o) applying a source mask onto the top surface of the epitaxial layer; and (p) carrying out a source implantation of the first conductivity type dopant and a source diffusion to form source regions.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description to explain the principles of the invention. In the drawings.

DETAILED DESCRIPTION OF THE EMBODIMENTS

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
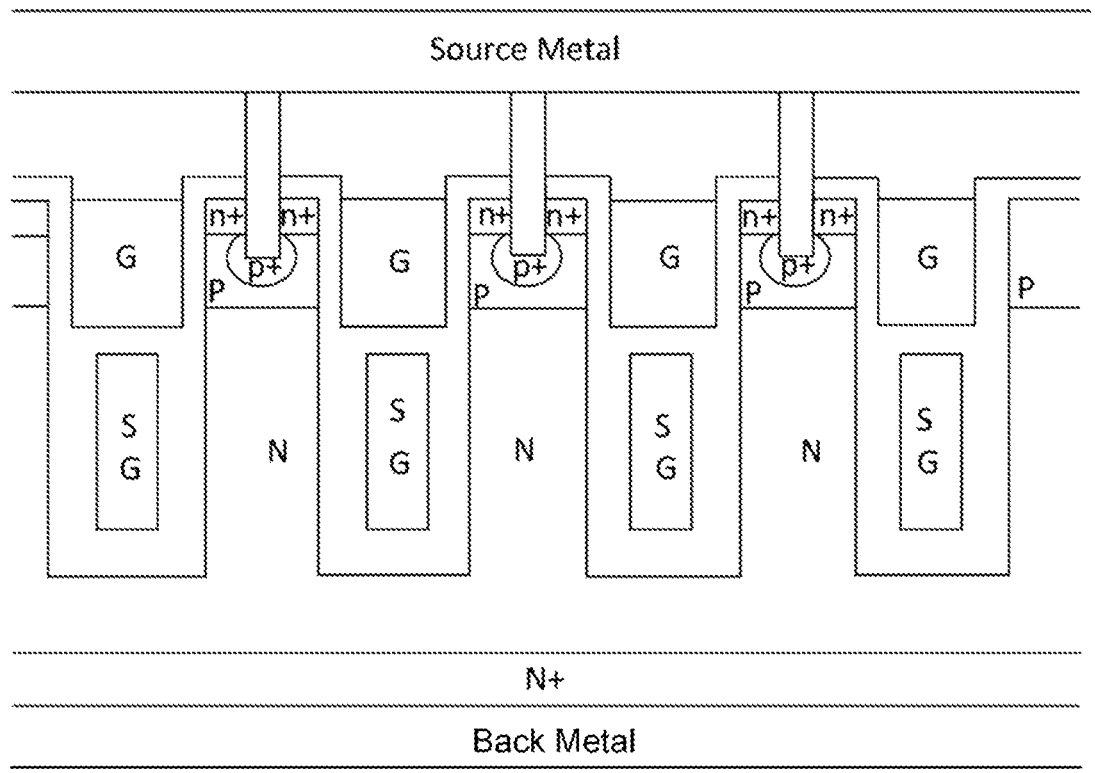
FIG. 1A is a cross-sectional view of a conventional SGT MOSFET of prior art.
Figure 1B:
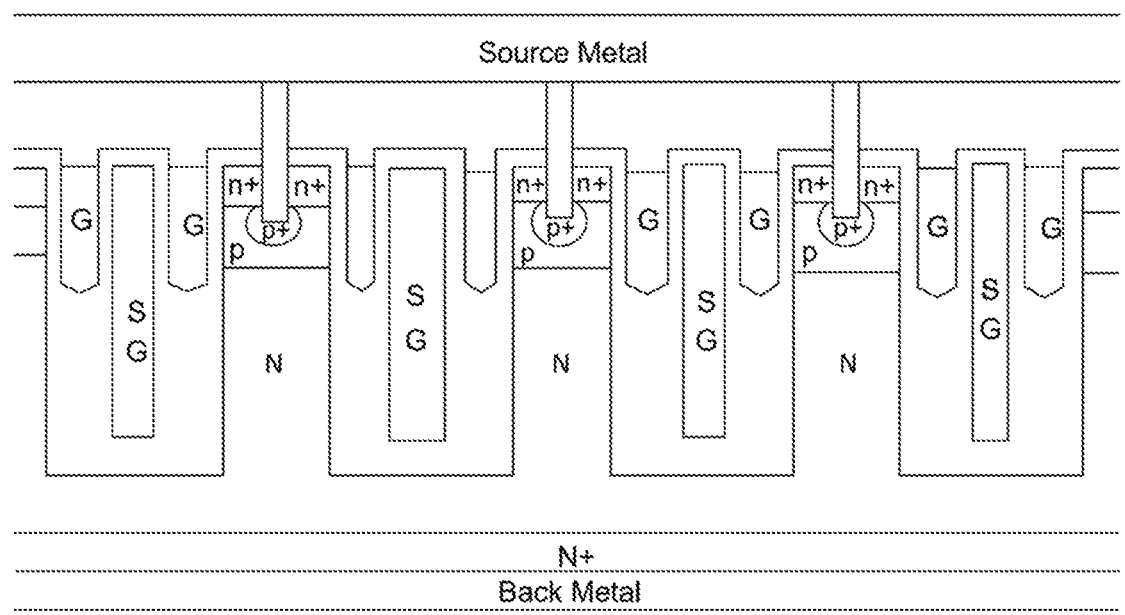
FIG. 1B is a cross-sectional view of another conventional SGT MOSFET of prior art.
Figure 1C:
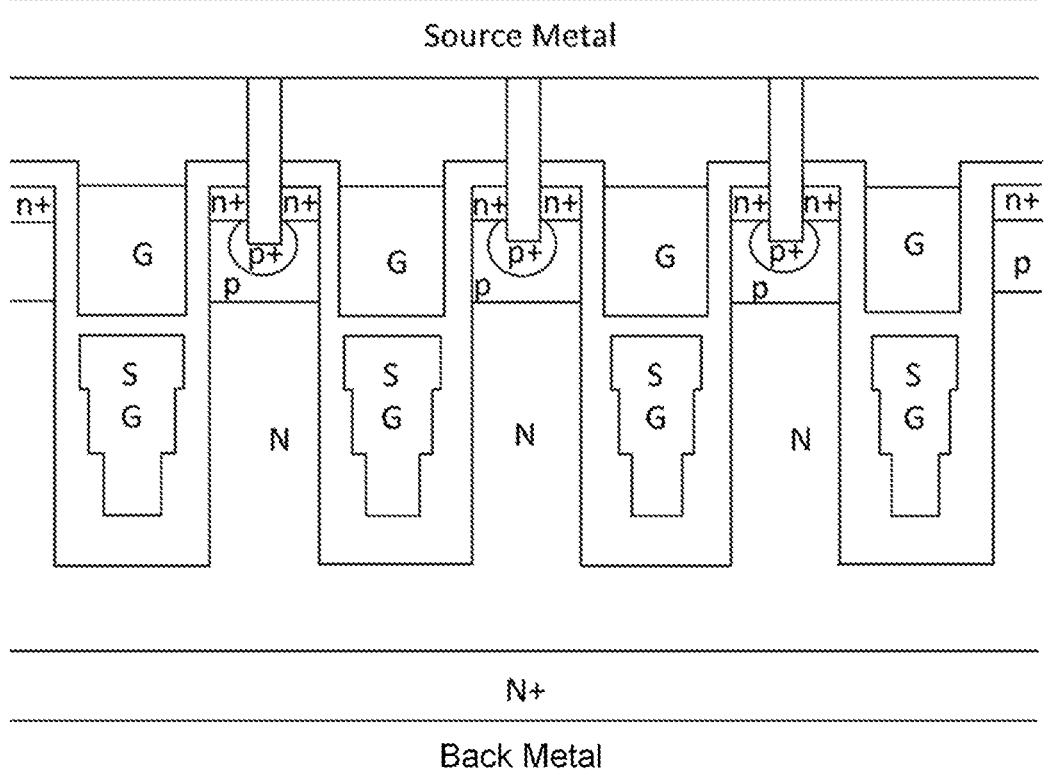
FIG. 1C is a cross-sectional view of MSO MOSFET of prior art
Figure 2A:
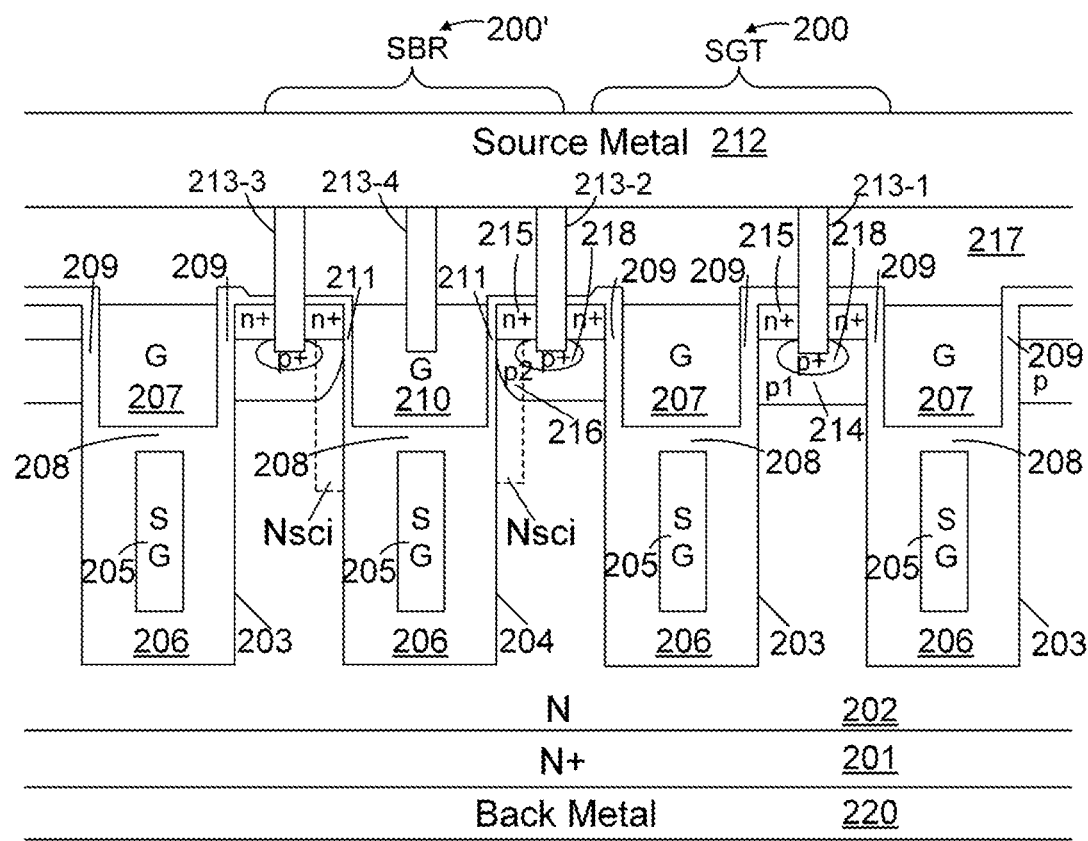
FIG. 2A is a cross-sectional view of a preferred embodiment according to the present invention.

Please refer to FIG. 2A for a preferred embodiment of this invention wherein an N-channel SGT MOSFET 200 and an SBR 200' are integrated on a single chip which is formed on an N+ substrate 201 with a less doped single N epitaxial layer 202 extending thereon, wherein the N+ substrate is coated with a back metal 220 of Ti/Ni/Ag on rear side as a drain metal. Inside the N epitaxial layer 202, a plurality of first type trenches 203 and at least one second type trench 204 are formed vertically downward, each filled with a shielded gate structure comprising a shielded electrode 205 (SG; as illustrated) padded by a first insulating film 206 in lower portion. The difference of the filling-in structure between the first and the second type trenches is that: the first type trenches 203 comprise a first gate electrode 207 which is isolated from the shielded electrode 205 by a second insulating film 208 while insulated from the N epitaxial layer by a first gate oxide film 209 (GOX1), and the first gate electrode 207 is further connected to a gate metal (not shown) of the SGT 200; the second type trench 204 comprises a second gate electrode 210 which is isolated from the shielded electrode 205 by the second insulating film 208 while insulated from the N epitaxial layer by a second gate oxide film 211 (GOX2), wherein the second gate oxide film 211 has a thinner thickness than the first gate oxide film 209 for formation of SBR, and furthermore, the second gate electrode 210 is connected to a source metal 212 through a trenched contact 213-4. In the SGT MOSFET, a p1 body region 214 having a n+ source region 215 thereon is extending in upper portion of the N epitaxial layer and surrounding the first gate electrodes 207 padded by the first gate oxide film 209, wherein a first channel region is formed between the p1 body region 214 and the source region 215; while in the SBR, a short channel implant region (illustrated as Nsci) is formed along upper sidewalls of the second type trench 204 surrounding the second gate electrode 210, a p2 body region 216 having the n+ source region 215 thereon is extending in upper portion of the N epitaxial layer and surrounding the second gate electrode 210 padded by the second gate oxide film 211, wherein the p2 body region 216 is formed into the short channel implant region by body implant, a second channel region is formed between the p2 body region 216 and the source region 215 having shorter channel length than the first channel region. The p1 body region 214, the p2 body region 216 and the n+ source region 215 both in the SGT and SBR are shorted to the source metal 212 through a plurality of trenched contacts 213-1, 213-2 and 213-3, respectively. All the trenched contacts (213-1~213-4) filled with metal plug and barriers are implemented by penetrating through a contact insulating layer 217 and extending into the body region, with each bottom surrounded by a p+ body contact region 218. Trench width and depth of the second type trench 204 are equal to or wider than the first type trenches 203 to avoid early breakdown occurring at the SBR region. Oxide charge balance regions formed between adjacent of the first type trenches 203 and the second type trenches 204.

Figure 2B:
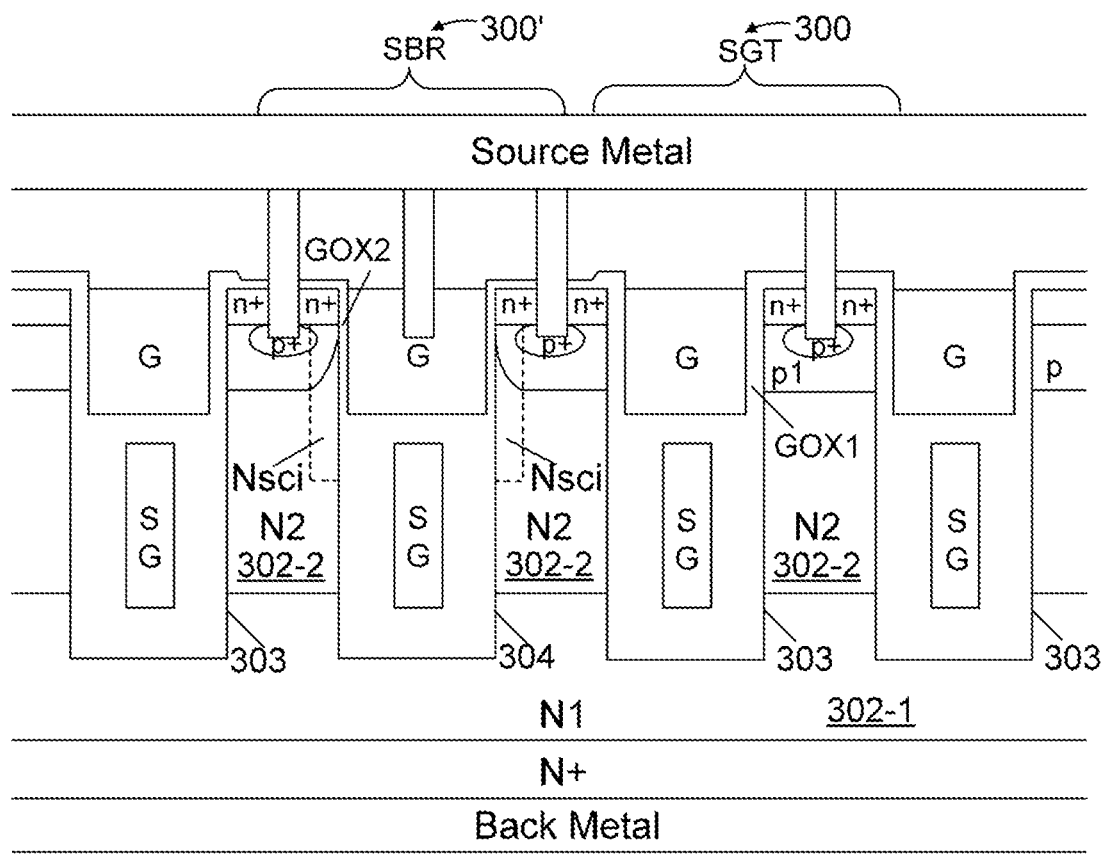
FIG. 2B is a cross-sectional view of another preferred embodiment according to the present invention.

Please refer to FIG. 2B for another preferred embodiment of the present invention, compared with FIG. 2A, the integrated circuit in FIG. 2B comprising an SGT MOSFET 300 and an SBR 300' is formed in an epitaxial layer, which further comprises a lower N1 epitaxial layer 302-1 with a resistivity R1 and an upper N2 epitaxial layer 302-2 with a resistivity R2, the first type trenches 303 in SGT and the second type trench 304 in SBR are all penetrating through the upper epitaxial layer 302-2 and having trench bottoms within the lower epitaxial layer 302-1. In this embodiment, the resistivity has a function relationship that R1>R2, to provide a higher resistivity epitaxial layer near the trench bottom corners for preventing an early breakdown, while to provide a lower resistivity epitaxial layer above the trench bottom to achieve a reduced device resistance.

Figure 3A:
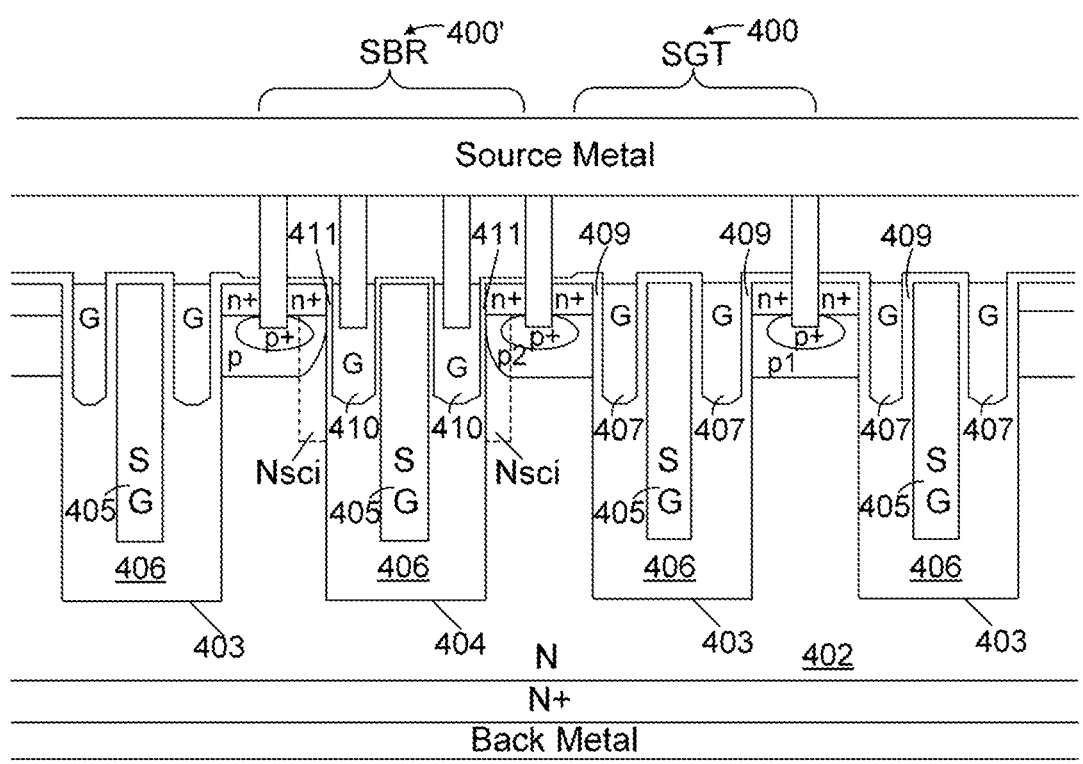
FIG. 3A is a cross-sectional view of another preferred embodiment according to the present invention.

Please refer to FIG. 3A for another preferred embodiment of the present invention, wherein an integrated circuit comprising an N-channel SGT MOSFET 400 and a SBR 400' has a similar device structure to FIG. 2A, except that, in FIG. 3A, the first type trenches 403 and the second type trench 404 comprise a different shielded gate structure. In the first type trenches 403 of the SGT MOSFET 400, the shielded gate structure comprises: a shielded electrode 405 disposed in the middle of the trench; a first gate electrode 407 disposed in the middle of the shielded electrode 405 and the trench sidewall in upper portion of the first type trenches 403; wherein the shielded electrode 405 is insulated from the N epitaxial layer 402 by a first insulating film 406, the first gate electrode 407 is isolated from the shielded electrode 405 and the epitaxial layer by a first gate oxide film 409 (GOX1). In the second type trench 404 of the SBR 400', the shielded gate structure comprises: the shielded electrode 405 disposed in the middle of the trench 404; a second gate electrode 410 disposed in the middle of the shielded electrode 405 and the trench sidewall in upper portion of the second type trench 404; wherein the shielded electrode 405 is insulated from the N epitaxial layer 402 by the first insulating film 406, the second gate electrode 410 is isolated from the shielded electrode 405 and the epitaxial layer by a second gate oxide film 411 (GOX2), wherein the second gate oxide film 411 has a thickness less than the first gate oxide film 409. Moreover, in the SBR, a short channel implant region (illustrated as Nsci) is formed along upper sidewalls of the second type trench 404 surrounding the second gate electrode 410.

Figure 3B:
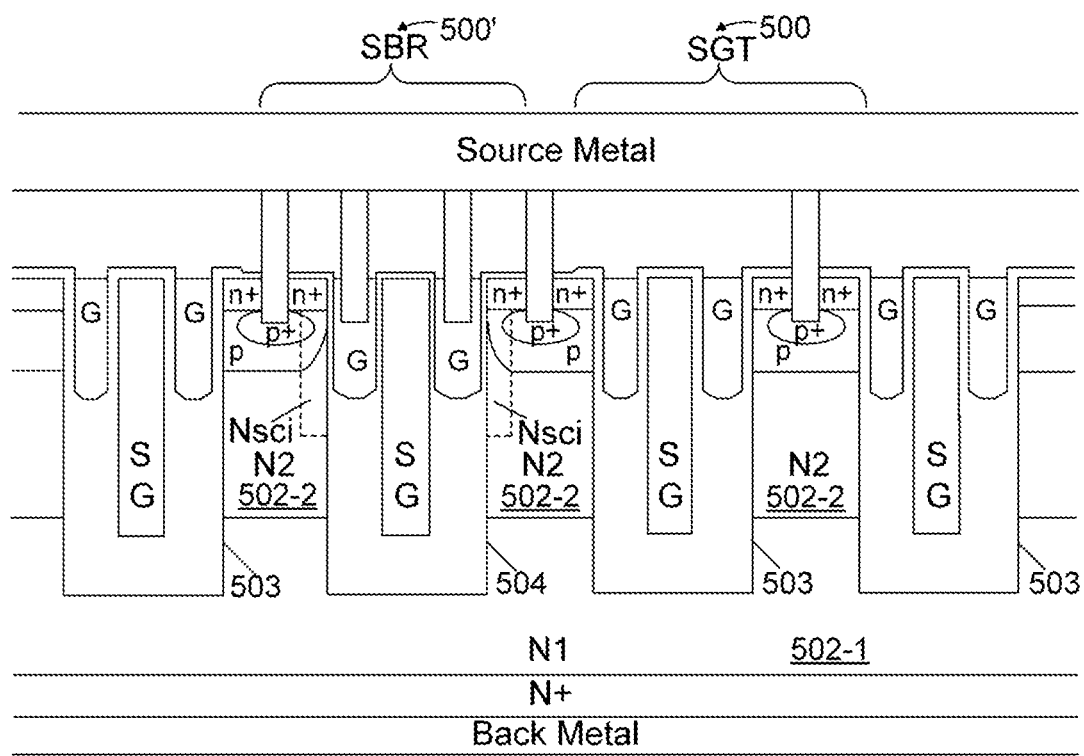
FIG. 3B is a cross-sectional view of another preferred embodiment according to the present invention.

Please refer to FIG. 3B for another preferred embodiment of the present invention, compared with FIG. 3A, the integrated circuit in FIG. 3B comprising an N-channel SGT MOSFET 500 and a SBR 500' is formed in an epitaxial layer, which further comprises a lower N1 epitaxial layer 502-1 with a resistivity R1 and an upper N2 epitaxial layer 502-2 with a resistivity R2, the first type trenches 503 in SGT and the second type trench 504 in SBR are all penetrating through the upper epitaxial layer 502-2 and having trench bottoms within the lower epitaxial layer 502-1. In this embodiment, the resistivity has a function relationship that R1>R2, to provide a higher resistivity epitaxial layer near the trench bottom corners for preventing an early breakdown, while to provide a lower resistivity epitaxial layer above the trench bottom to achieve a reduced device resistance.

Figure 4A:
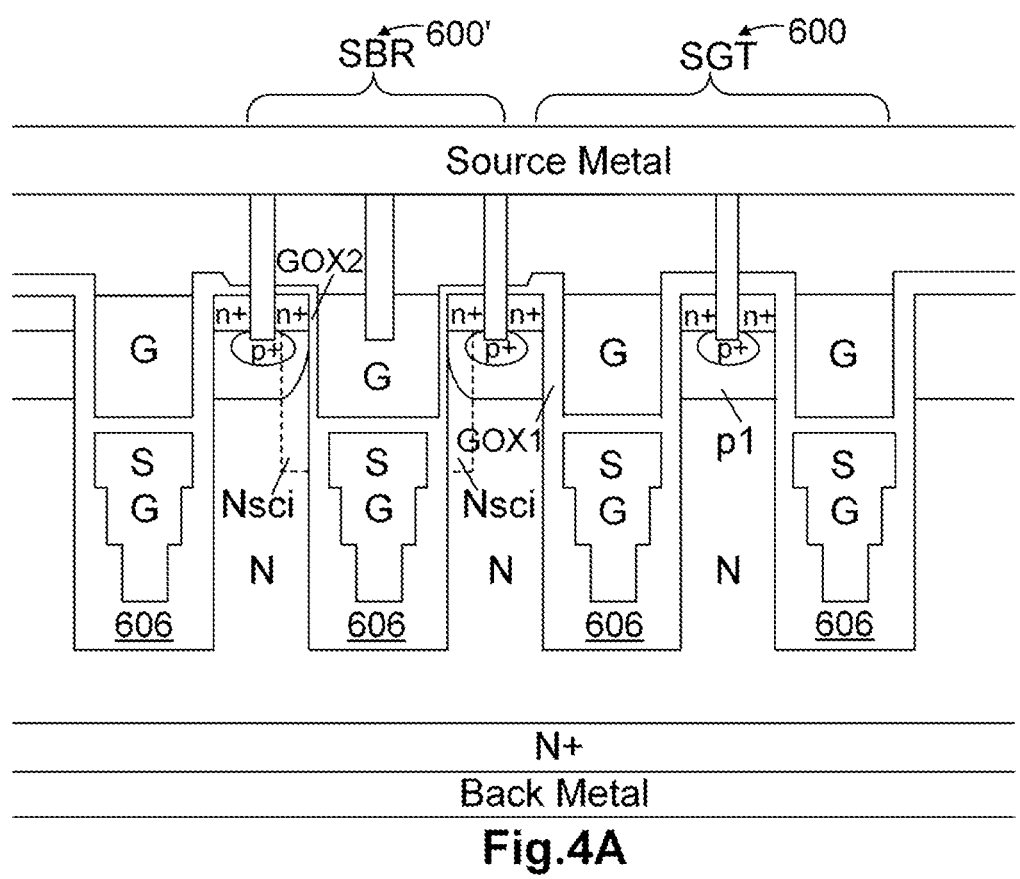
FIG. 4A is a cross-sectional view of another preferred embodiment according to the present invention.

Please refer to FIG. 4A for another preferred embodiment of the present invention, wherein an integrated circuit comprising an N-channel SGT MOSFET 600 and a SBR 600' has a similar device structure to FIG. 2A, except that, in FIG. 4A, the first insulating film 606 in all the trenches has MSO structure to further reduce the on-resistance while maintaining the same breakdown voltage. As shown in FIG. 4A, the first insulating film 606 has a greatest thickness along bottoms of all the trenches.

Figure 4B:
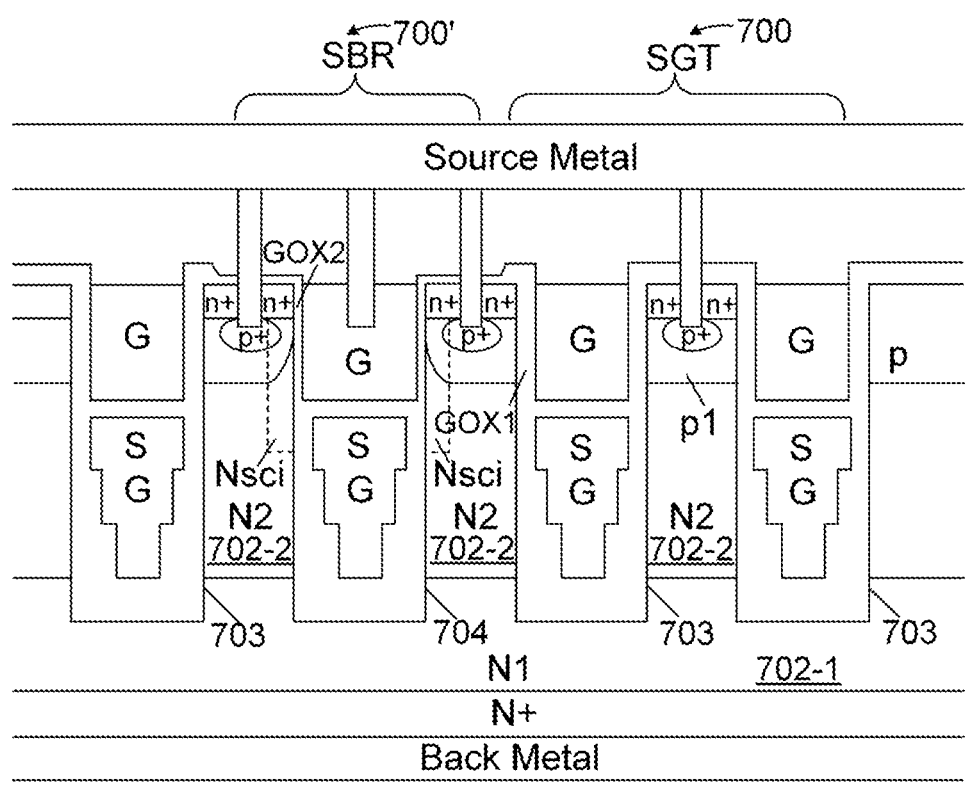
FIG. 4B is a cross-sectional view of another preferred embodiment according to the present invention.

Please refer to FIG. 4B for another preferred embodiment of the present invention, compared with FIG. 4A, the integrated circuit in FIG. 4B comprising an N-channel SGT MOSFET 700 and a SBR 700' is formed in an epitaxial layer, which further comprises a lower N1 epitaxial layer 702-1 with a resistivity R1 and an upper N2 epitaxial layer 702-2 with a resistivity R2, the first type trenches 703 in SGT and the second type trench 704 in SBR are all penetrating through the upper epitaxial layer 702-2 and having trench bottoms within the lower epitaxial layer 702-1. In this embodiment, the resistivity has a function relationship that R1>R2, to provide a higher resistivity epitaxial layer near the trench bottom corners for preventing an early breakdown, while to provide a lower resistivity epitaxial layer above the trench bottom to achieve a reduced device resistance.

Figure 5A:
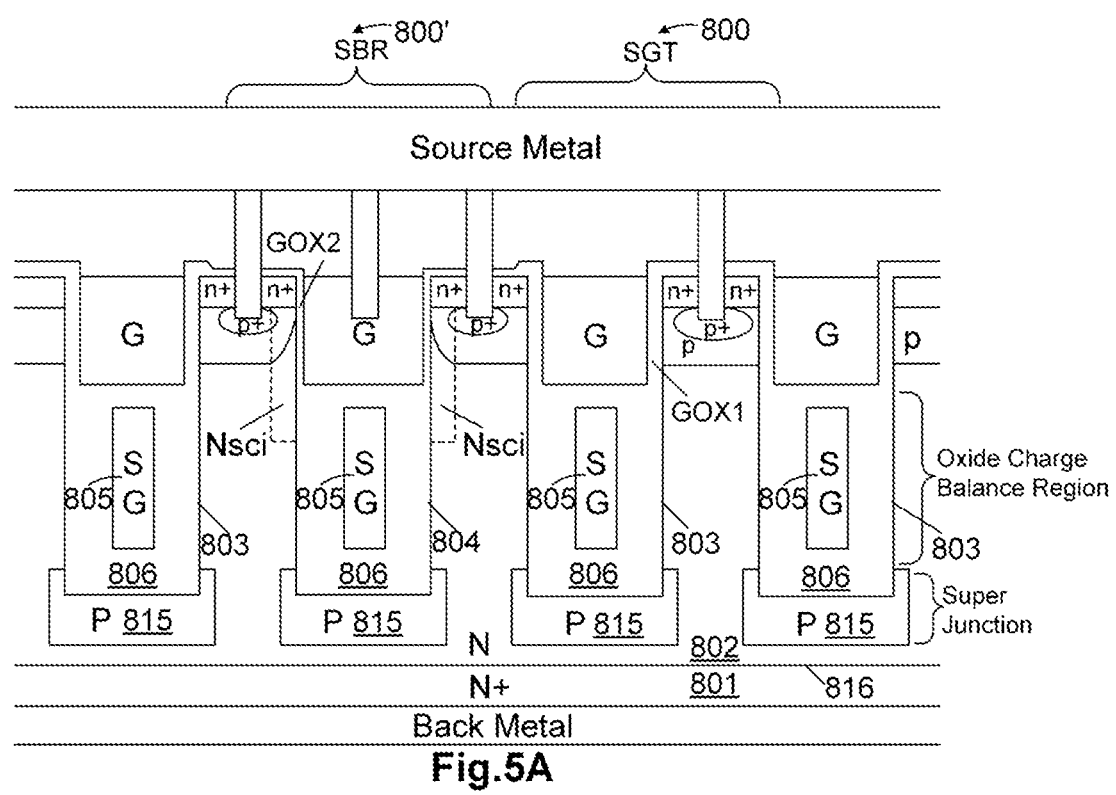
FIG. 5A is a cross-sectional view of another preferred embodiment according to the present invention.

Please refer to FIG. 5A for another preferred embodiment of the present invention, which has a similar structure to FIG. 2A, except that, super junction structure is included in this invention. According to the invention, an oxide charge balance region is therefore formed between adjacent of the trenched gates, meanwhile, around bottoms of the trenched gates 803 and 804, P regions 815 are introduced into the N epitaxial layer 802 to form a super junction to act as junction charge balance region, comprising a plurality of alternating P regions 815 and N regions 802 above the N+ substrate 801 and below the oxide charge balance region to ensure that whole drift region is fully depleted and breakdown occurs at middle of adjacent trenched gates without having early breakdown voltage occurring at trench bottom, and at the same time, to significantly relax the sensitivity of breakdown voltage on trench bottom thickness and trench depth. According to this embodiment, the P regions 815 are mainly disposed below bottoms of the shielded gate electrodes 805 in the trenched gates 803 and 804 without touching to bottom surface 816 of the epitaxial layer. The P regions 815 can be easily formed by multiple ion-implantation of boron through bottom of the trench gates 803 and 804 with various implantation energies.

Figure 5B:
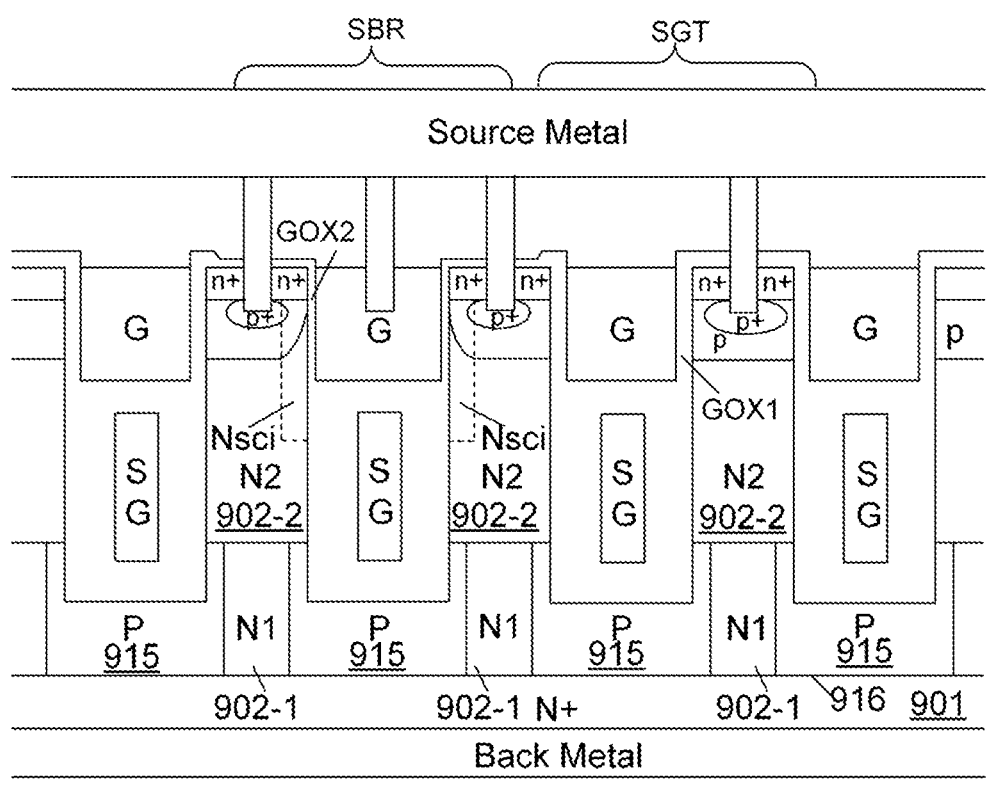
FIG. 5B is a cross-sectional view of another preferred embodiment according to the present invention.

Please refer to FIG. 5B for another preferred embodiment of the present invention, which has a similar structure to FIG. 5A, except that, the epitaxial layer in FIG. 5B further comprises a lower N1 epitaxial layer 902-1 with a resistivity R1 and an upper N2 epitaxial layer 902-2 with a resistivity R2. In this embodiment, the resistivity has a function relationship that R1>R2, to provide a higher resistivity epitaxial layer near the trench bottom corners for preventing an early breakdown, while to provide a lower resistivity epitaxial layer above the trench bottom to achieve a reduced device resistance. Moreover, the super junction region comprises a plurality of alternating P regions 915 and the lower N1 epitaxial layer 902-1, wherein the P regions 915 are mainly disposed below bottoms of the shielded gate electrodes in the trenched gates and touch to bottom surface 916 of the epitaxial layer.

Figure 6A:
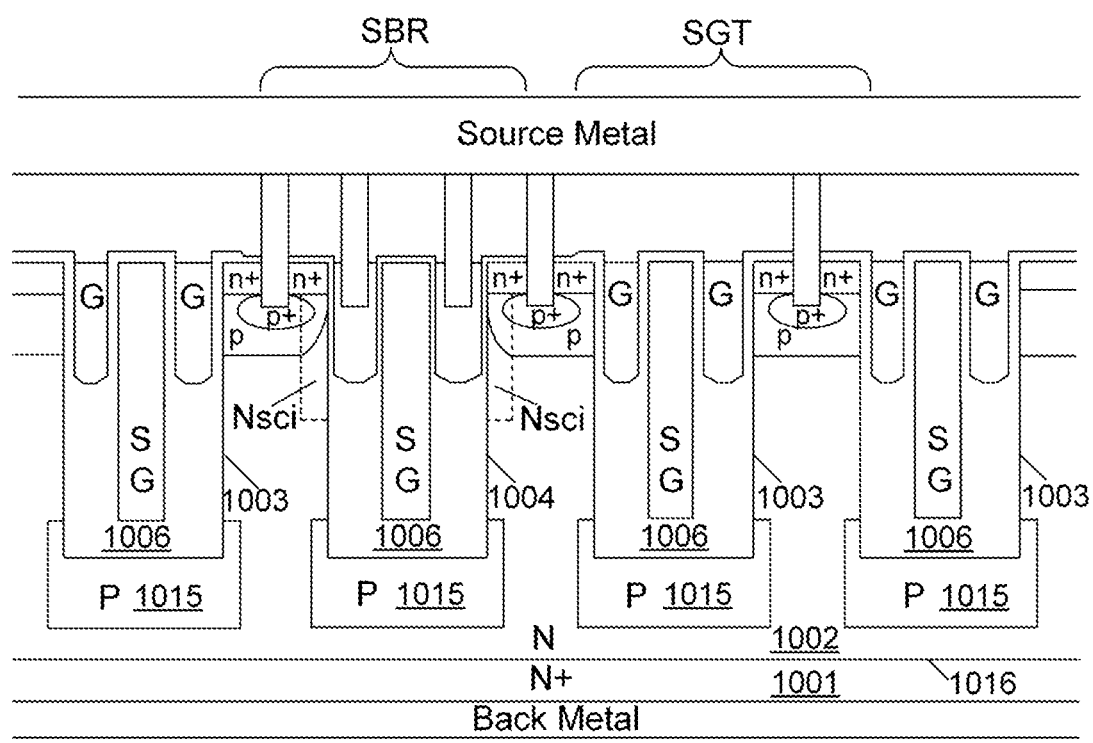
FIG. 6A is a cross-sectional view of another preferred embodiment according to the present invention.

Please refer to FIG. 6A for another preferred embodiment of the present invention, which has a similar structure to FIG. 3A, except that, super junction structure is included in this invention. According to the invention, an oxide charge balance region is therefore formed between adjacent of the trenched gates, meanwhile, around bottoms of the trenched gates 1003 and 1004, P regions 1015 are introduced into the N epitaxial layer 1002 to form a super junction to act as junction charge balance region, comprising a plurality of alternating P regions 1015 and N regions 1002 above the N+ substrate 1001 and below the oxide charge balance region to ensure that whole drift region is fully depleted and breakdown occurs at middle of adjacent trenched gates without having early breakdown voltage occurring at trench bottom, and at the same time, to significantly relax the sensitivity of breakdown voltage on trench bottom thickness and trench depth. According to this embodiment, the P regions 1015 are mainly disposed below bottoms of the shielded gate electrodes (illustrated as SG) in the trenched gates 1003 and 1004 without touching to bottom surface 1016 of the epitaxial layer. The P regions 1015 can be easily formed by multiple ion-implantation of boron through bottom of the trench gates 1003 and 1004 with various implantation energies.

Figure 6B:
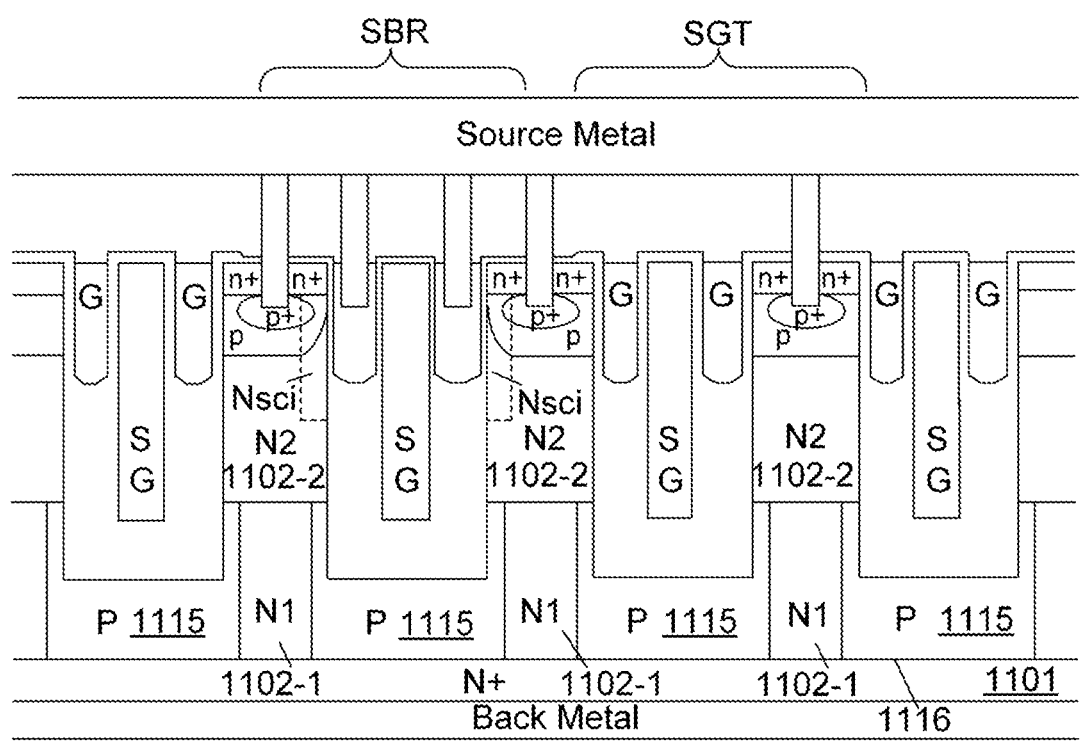
FIG. 6B is a cross-sectional view of another preferred embodiment according to the present invention.

Please refer to FIG. 6B for another preferred embodiment of the present invention, which has a similar structure to FIG. 6A, except that, the epitaxial layer in FIG. 6B further comprises a lower N1 epitaxial layer 1102-1 with a resistivity R1 and an upper N2 epitaxial layer 1102-2 with a resistivity R2. In this embodiment, the resistivity has a function relationship that R1>R2, to provide a higher resistivity epitaxial layer near the trench bottom corners for preventing an early breakdown, while to provide a lower resistivity epitaxial layer above the trench bottom to achieve a reduced device resistance. Moreover, the super junction region comprises a plurality of alternating P regions 1115 and the lower N1 epitaxial layer 1102-1, wherein the P regions 1115 are mainly disposed below bottoms of the shielded gate electrodes (illustrated as GS) in the trenched gates and touch to bottom surface 1116 of the epitaxial layer.

Figure 7A:
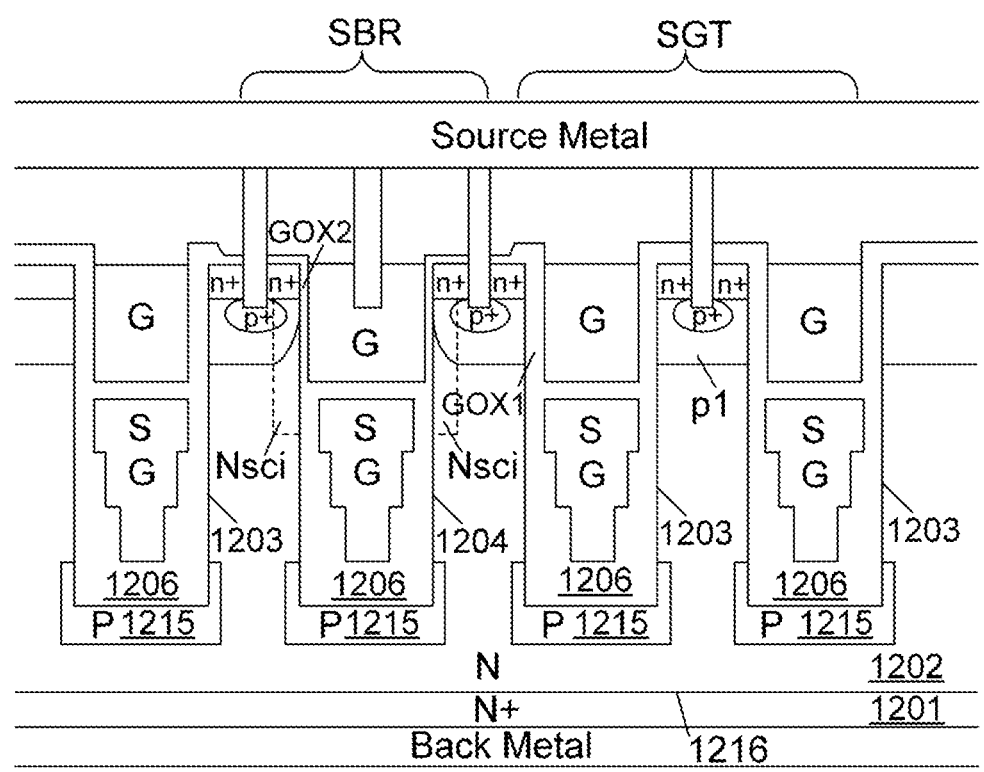
FIG. 7A is a cross-sectional view of another preferred embodiment according to the present invention.

Please refer to FIG. 7A for another preferred embodiment of the present invention, which has a similar structure to FIG. 4A, except that, super junction structure is included in this invention. According to the invention, an oxide charge balance region is therefore formed between adjacent of the trenched gates, meanwhile, around bottoms of the trenched gates 1203 and 1204, P regions 1215 are introduced into the N epitaxial layer 1202 to form a super junction to act as junction charge balance region, comprising a plurality of alternating P regions 1215 and N regions 1202 above the N+ substrate 1201 and below the oxide charge balance region to ensure that whole drift region is fully depleted and breakdown occurs at middle of adjacent trenched gates without having early breakdown voltage occurring at trench bottom, and at the same time, to significantly relax the sensitivity of breakdown voltage on trench bottom thickness and trench depth. According to this embodiment, the P regions 1215 are mainly disposed below bottoms of the shielded gate electrodes (illustrated as SG) in the trenched gates 1203 and 1204 without touching to bottom surface 1216 of the epitaxial layer. The P regions 1215 can be easily formed by multiple ion-implantation of boron through bottom of the trench gates 1203 and 1204 with various implantation energies.

Figure 7B:
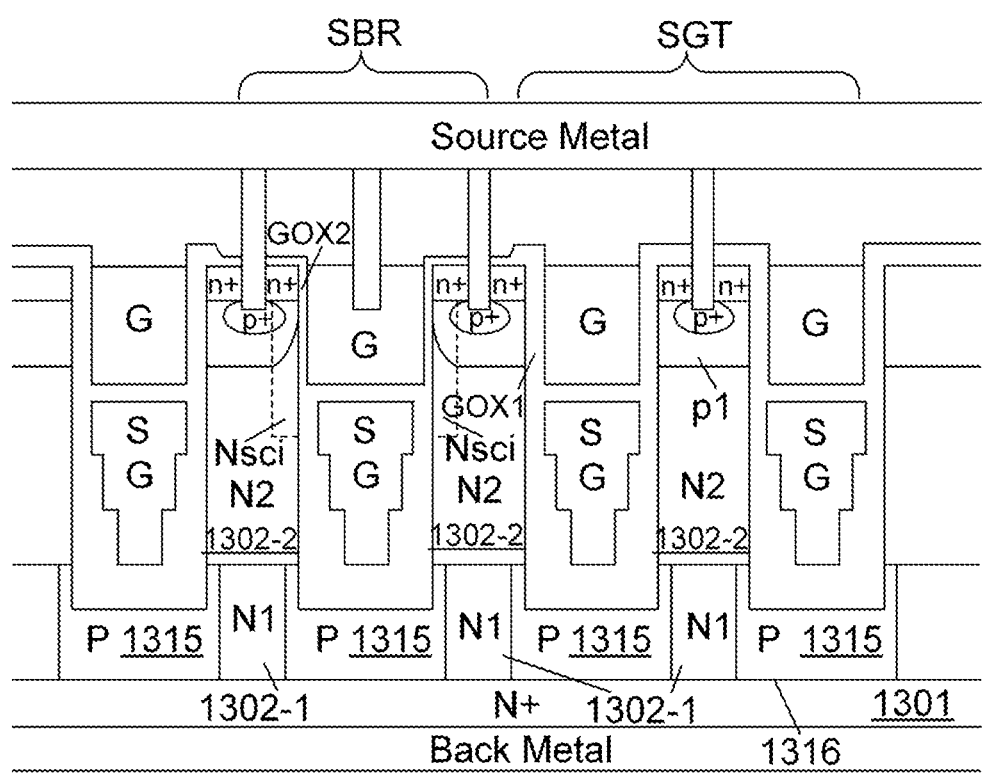
FIG. 7B is a cross-sectional view of another preferred embodiment according to the present invention.

Please refer to FIG. 7B for another preferred embodiment of the present invention, which has a similar structure to FIG. 7A, except that, the epitaxial layer in FIG. 7B further comprises a lower N1 epitaxial layer 1302-1 with a resistivity R1 and an upper N2 epitaxial layer 1302-2 with a resistivity R2. In this embodiment, the resistivity has a function relationship that R1>R2, to provide a higher resistivity epitaxial layer near the trench bottom corners for preventing an early breakdown, while to provide a lower resistivity epitaxial layer above the trench bottom to achieve a reduced device resistance. Moreover, the super junction region comprises a plurality of alternating P regions 1315 and the lower N1 epitaxial layer 1302-1, wherein the P regions 1315 are mainly disposed below bottoms of the shielded gate electrodes (illustrated as GS) in the trenched gates and touch to bottom surface 1316 of the epitaxial layer.

Figure 8A:
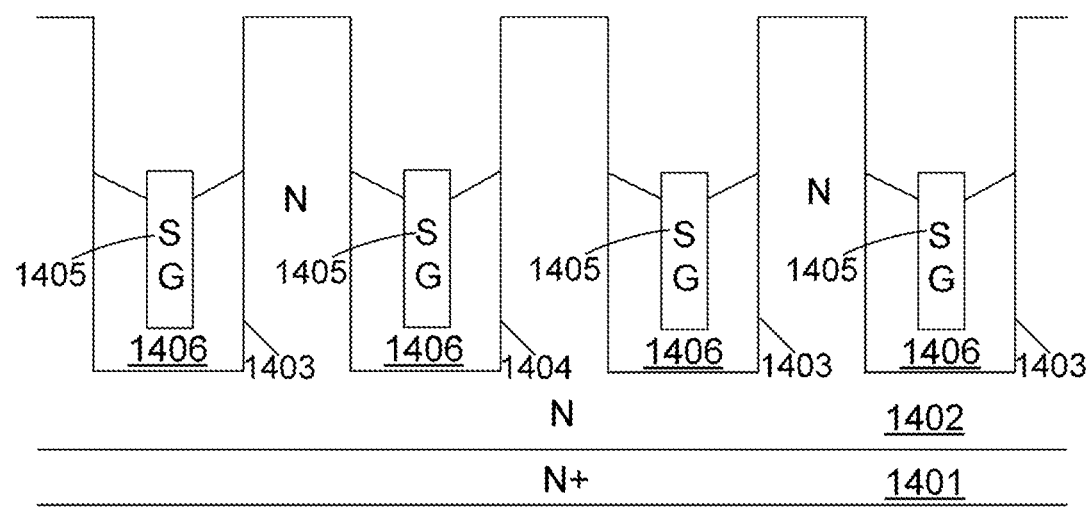
FIGS. 8A~8H are a serial of side cross-sectional views for showing the processing steps for fabricating the trench MOSFET of FIG. 2A.

FIGS. 8A~8H are a serial of exemplary steps that are performed to form the invention Embodiment of FIG. 2A. In FIG. 8A, an N epitaxial layer 1402 is grown on an N+ substrate 1401, a hard mask (not shown) such as an oxide layer is formed onto a top surface of the N epitaxial layer 1402 for definition of areas for a plurality of gate trenches. Then, after dry oxide etch and dry silicon etch, a plurality of gate trenches 1403 and 1404 are etched penetrating through open regions in the hard mask, the N epitaxial layer 1402, not reaching the bottom surface of N epitaxial layer 1402. Mesas are formed between every two adjacent gate trenches in the N epitaxial layer 1402. Then, a sacrificial oxide layer (not shown) is first grown and then removed to eliminate the plasma damage after forming the gate trenches 1403 and 1404. The hard mask is removed, then, a first gate insulation layer 1406 comprising a thick oxide layer is formed lining the inner surface of the gate trenches by thermal oxide growth or thick oxide deposition. A first doped poly-silicon layer is deposited onto the first gate insulation layer 1406 to fill the gate trenches 1403 and 1404, and is then etched back from the top surface of the N epitaxial layer 1402 to serve as the shielded gate electrode 1405. Next, the first gate insulation layer 1406 is etched back from top surface of the epitaxial layer and an upper portion of the gate trenches 1403 and 1404.

Figure 8B:
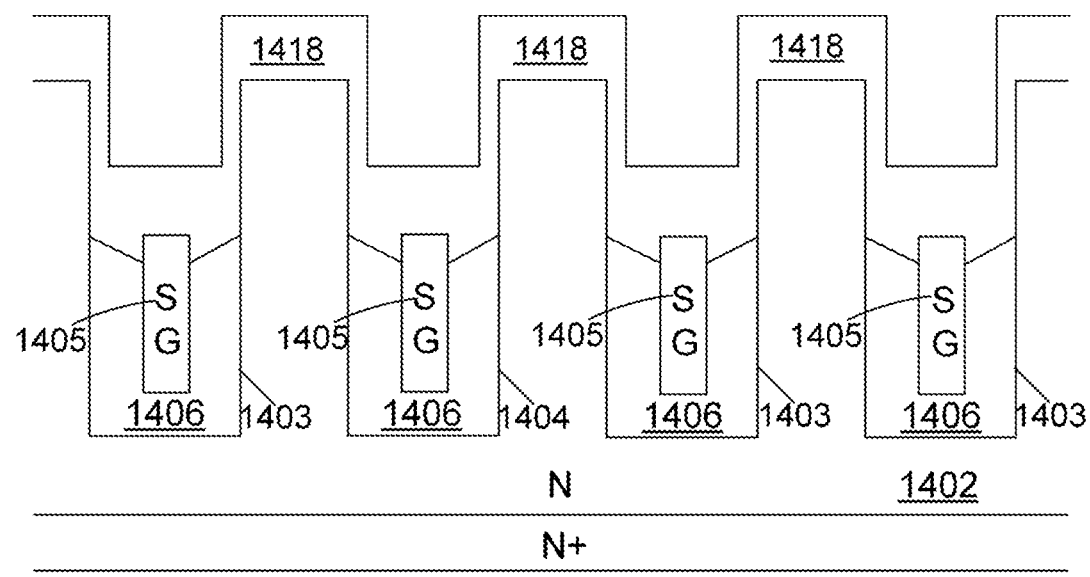

In FIG. 8B, another gate insulation layer 1418 is formed by high density plasma oxide deposition along upper inner surfaces of the gate trenches 1403 and 1404, covering a top surface of the first gate insulation layer 1406, the shielded gate electrode 1405 and the epitaxy layer 1402.

Figure 8C:
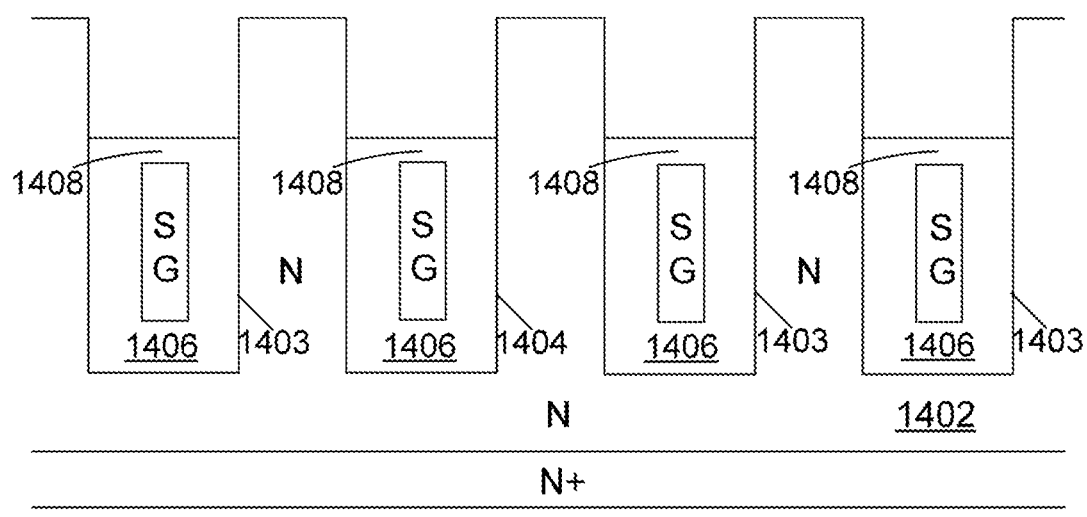

In FIG. 8C, the gate insulation layer 1418 is etched back by oxide CMP (Chemical Mechanical Polishing) or by Wet Oxide Etching to form the second insulation layer 1408.

Figure 8D:
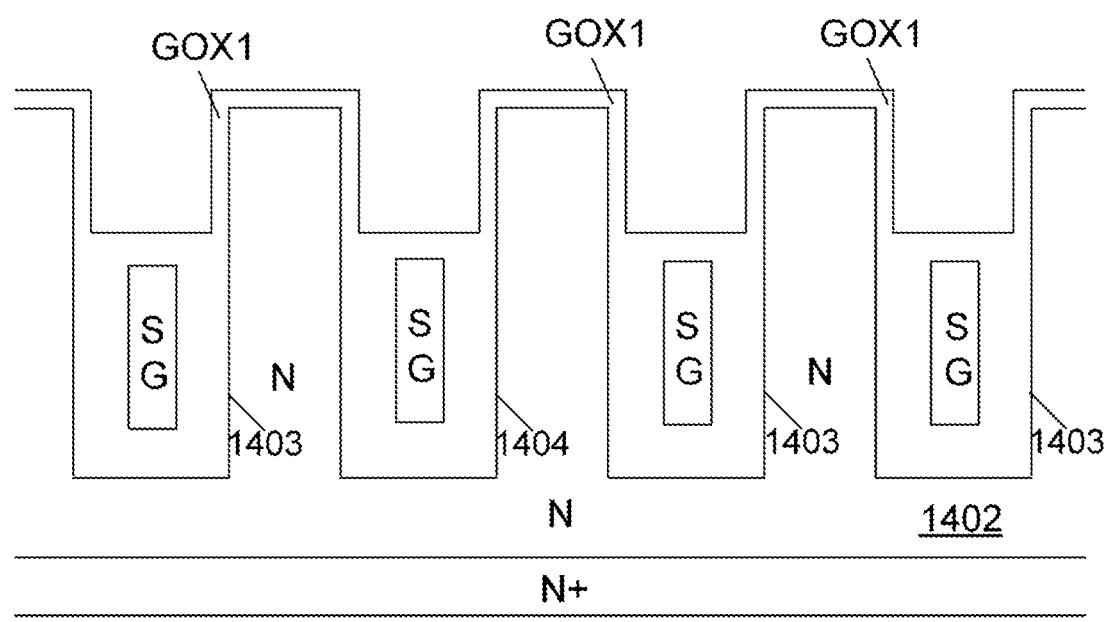

In FIG. 8D, a thick gate oxide is grown along upper inner surfaces of the gate trenches 1403 and 1404 and top surface of epitaxy layer 1402 as the first gate oxide (illustrated as GOX1).

Figure 8E:
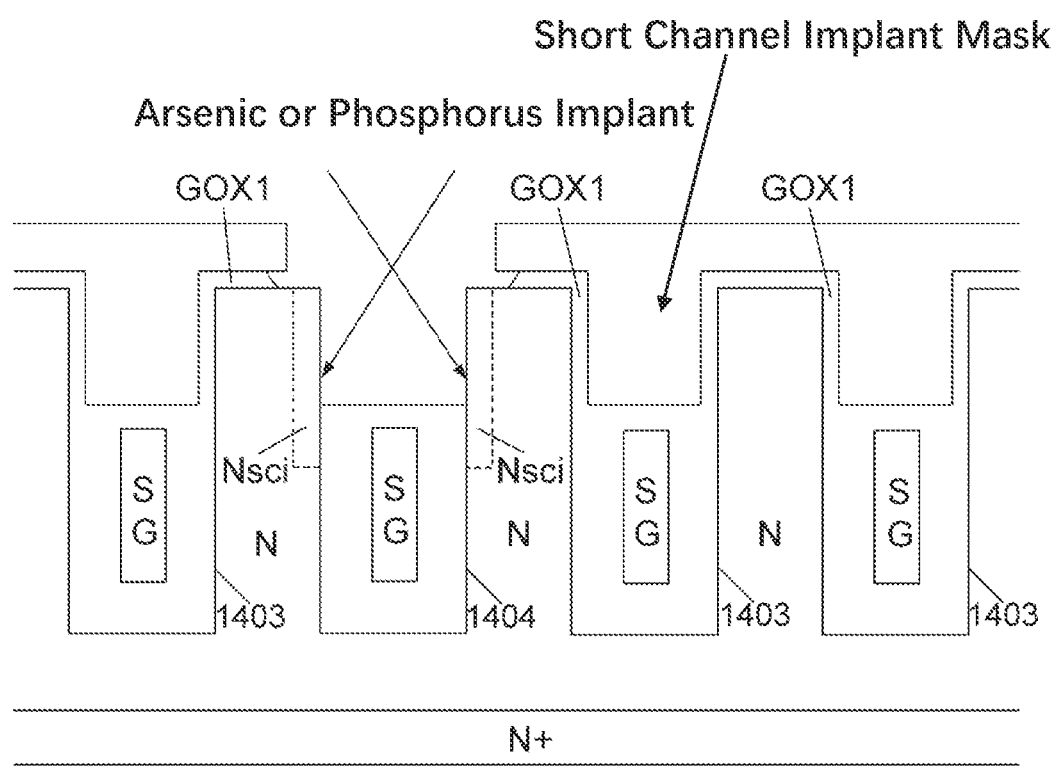

In FIG. 8E, a short channel implant mask is covered onto the top surface of the first gate oxide layer (GOX1), and followed by wet oxide etch of the first gate oxide layer (GOX1). Then, angle implantation of Arsenic or Phosphorus Implant to form short channel implant (illustrate as Nsci) region, which is along upper sidewalls of gate trench 1404.

Figure 8F:
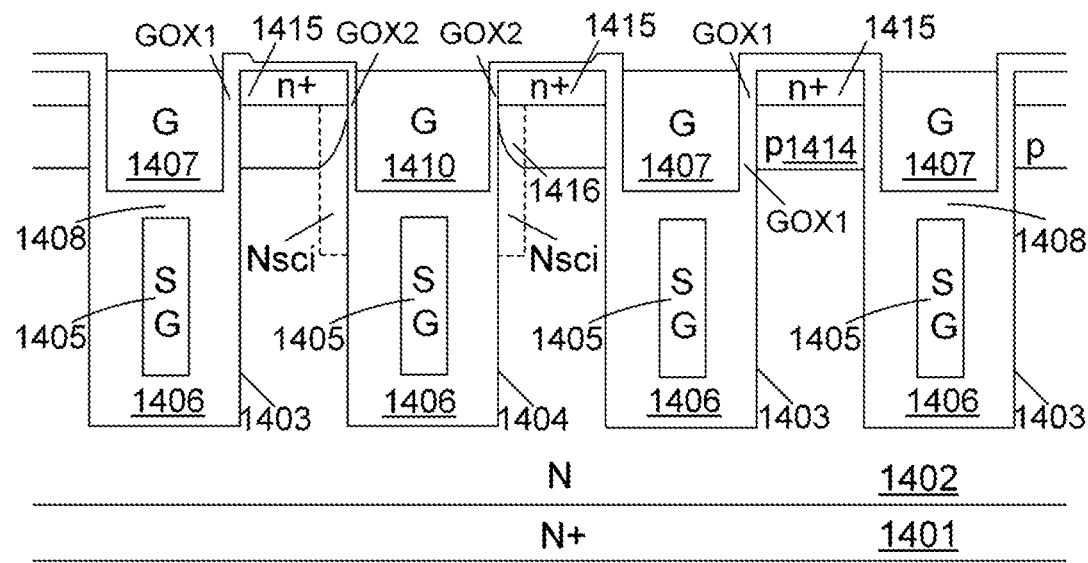

In FIG. 8F, a thinner gate oxide is grown along upper inner surfaces of gate trench 1404 as the second gate oxide (illustrated as GOX2). A second doped poly-silicon layer is deposited filling the upper portion of the gate trenches 1403 and 1404, and is then etched back by CMP (Chemical Mechanical Polishing) or Plasma Etch or Poly recess etch to serve as the gate electrodes 1407 and 1410, respectively. Then, a body implantation of p conductivity type dopant followed by diffusion process is carried out over entire top surface to form p body regions 1414 and 1416 between every two adjacent gate trenches. After applying a source mask (not shown) onto the top surface of the epitaxial layer, a source implantation of n conductivity type dopant and a diffusion step are successively carried out to form an n+ source region 1415 near a top surface of the p body regions 1414 between two adjacent gate trenches.

Figure 8G:
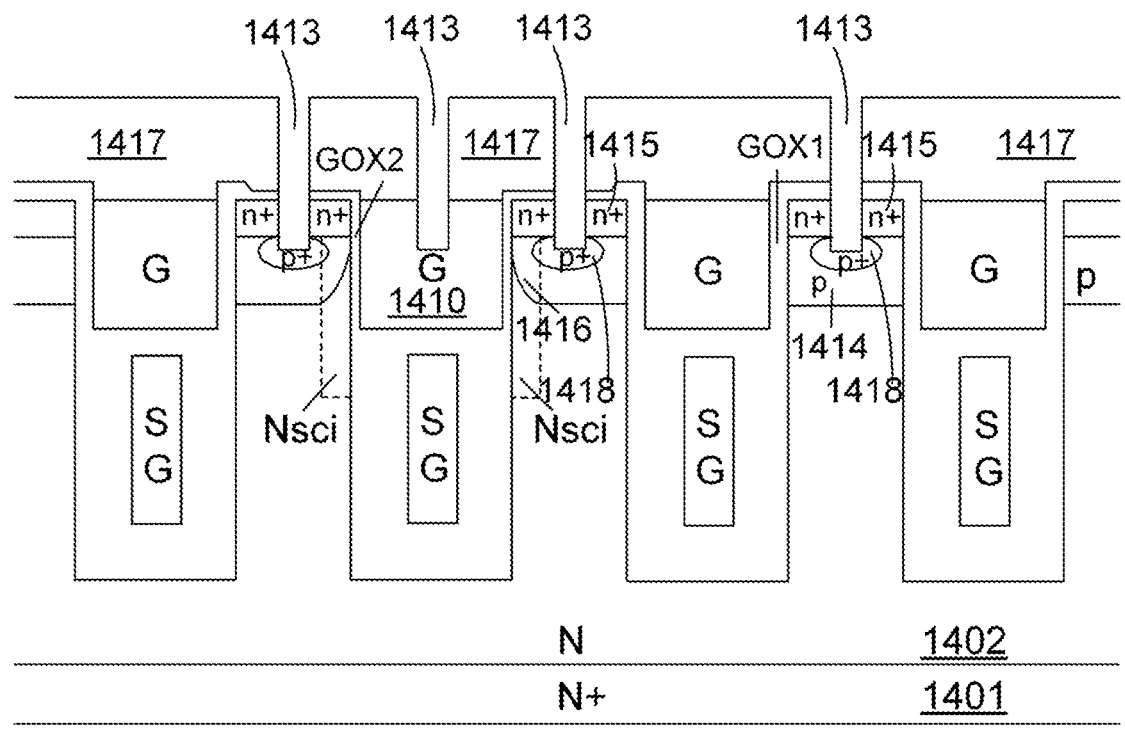

In FIG. 8G, another oxide layer is deposited onto the top surface of the epitaxial layer to serve as a contact interlayer 1417. Then, after applying a contact mask (not shown) onto the contact interlayer 1417, a plurality of trenched contacts 1413 are formed by successively dry oxide etch and dry silicon etch penetrating through the contact interlayer 1417, and extending into the p body regions 1414 and 1416 for trenched source-body contacts, and into the gate electrode 1410 for trenched gate contacts, respectively. Next, a BF2 Ion Implantation is performed to form a p+ body contact doped region 1418 within the p body regions 1414 and 1416 and surrounding at least bottom of the trenched source body-contacts penetrating through the n+ source region 1415.

Figure 8H:
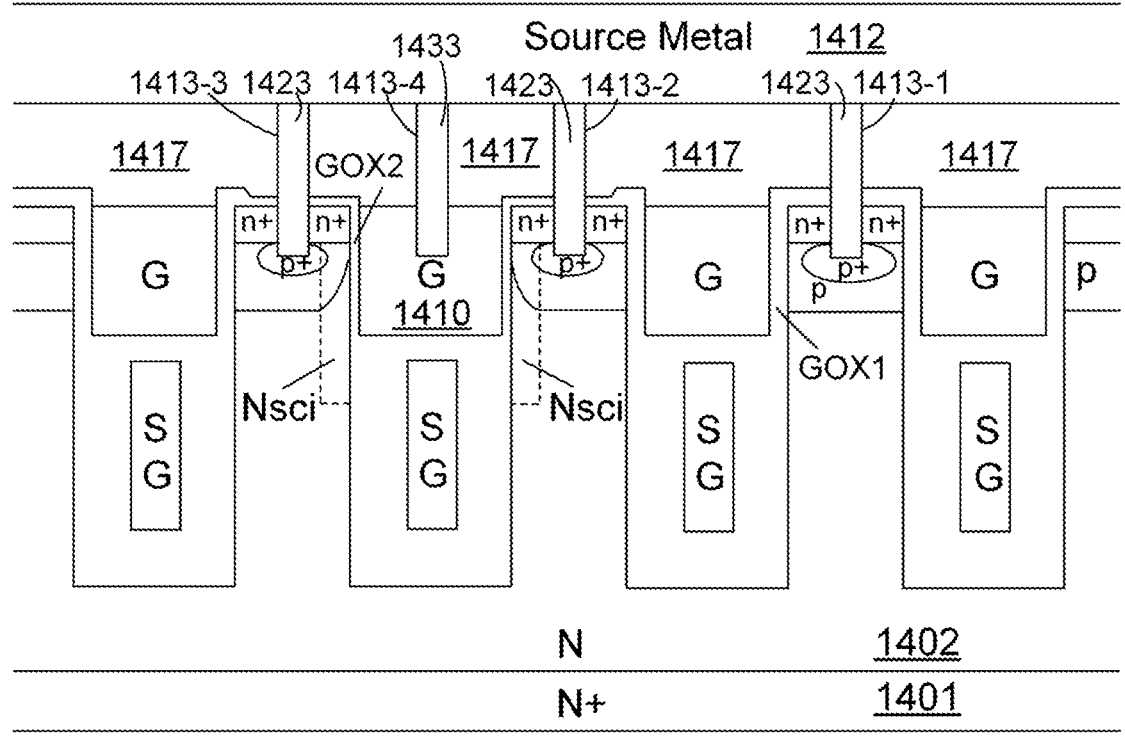

In FIG. 8H, a barrier metal layer of Ti/TiN or Co/TiN or Ta/TiN is deposited on sidewalls and bottoms of all the trenched contacts followed by a step of RTA process for silicide formation. Then, a tungsten material layer is deposited onto the barrier layer, wherein the tungsten material layer and the barrier layer are then etched back to form: contact metal plug 1423 for the trenched source-body contacts 1413-1, 1413-2, 1413-3; and contact metal plug 1433 for the trenched gate contacts 1413-4. Then, a metal layer of Al alloys or Cu padded by a resistance-reduction layer Ti or Ti/TiN underneath is deposited onto the contact interlayer 1417 and followed by a metal etching process by employing a metal mask (not shown) to be patterned as a source metal 1412.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An integrated circuit comprising a shielded gate trench (SGT) MOSFET and a super barrier rectifier (SBR) horizontally disposed in two different areas on single chip, further comprising:
   an epitaxial layer of a first conductivity type extending over a substrate of said first conductivity type, said substrate having a higher doping concentration than said epitaxial layer;
   said SGT MOSFET further comprising:
   a plurality of first type trenches formed in said epitaxial layer, each of said first type trenches being filled with a first shielded electrode and a first gate electrode, said first shielded electrode being insulated from said epitaxial layer by a first insulating film, said first gate electrode being insulated from said epitaxial layer by a first gate oxide film, and said first shielded electrode and said first gate electrode being insulated from each other;
   a first body region of a second conductivity type formed by a body implant having a source region of said first conductivity type thereon and surrounding said first gate electrode padded by said first gate oxide film;
   a first channel region is formed between said first body region and said source region;
   said SBR further comprising:
   at least one second type trench formed in parallel with said first type trenches, said second type trench being filled with a second shielded electrode and a second gate electrode, said second shielded electrode being insulated from said epitaxial layer by a second insulating film, said second gate electrode being insulated from said epitaxial layer by a second gate oxide film, and said second shielded electrode and said second gate electrode being insulated from each other;
   said second gate oxide film having a thickness less than said first gate oxide film;
   a short channel implant region is formed along upper sidewalls of said second type trench surrounding said second gate electrode;
   a second body region of said second conductivity type having said source region thereon and surrounding said second gate electrode padded by said second gate oxide film;
   said second body region is formed into said short channel implant region by said body implant;
   a second channel region is formed between said second body region and said source region having shorter channel length than said first channel region; and said first body region, said second body region, said source region and said second gate electrode being shorted to a source metal through a plurality of trenched contacts.

2. The integrated circuit of claim 1, wherein said epitaxial layer comprises a single epitaxial layer having uniform doping concentration.

3. The integrated circuit of claim 1, wherein said epitaxial layer comprises a lower epitaxial layer with a resistivity R1 and an upper epitaxial layer with a resistivity R2, wherein R1>R2, said first and second type trenches are penetrating through said upper epitaxial layer and extending into said lower epitaxial layer.

4. The integrated circuit of claim 1, wherein with each of said first type trenches, said first shielded electrode is disposed in a lower portion and said first gate electrode is disposed in an upper portion, said first shielded electrode and said first gate electrode are insulated from each other by a third insulating film; with said second type trench, said second shielded electrode is disposed in a lower portion and said second gate electrode is disposed in an upper portion, said second shielded electrode and said second gate electrode are insulated from each other by a fourth insulating film.

5. The integrated circuit of claim 4, wherein said first insulating film is a single oxide film having uniform thickness.

6. The integrated circuit of claim 4, wherein said first insulating film has a multiple stepped oxide structure having greatest thickness along a bottom of said first and second type trenches.

7. The integrated circuit of claim 1, wherein within each of said first type trenches, said shielded electrode is disposed in the middle and said first gate electrode is disposed surrounding an upper portion of said shielded electrode, said shielded electrode and said first gate electrode are insulated from each other by said first gate oxide film; within said second type trench, said shielded electrode is disposed in the middle and said second gate electrode is disposed surrounding an upper portion of said shielded electrode, said shielded electrode and said second gate electrode are insulated from each other by said second gate oxide film.

8. The integrated circuit of claim 1, wherein said second type trench has a trench width and a trench depth same as said first type trenches.

9. The integrated circuit of claim 1, wherein said second type trench has a trench width and a trench depth greater than said first type trenches.

10. The integrated circuit of claim 1, further comprising a super junction structure with a plurality of alternating P and N regions disposed above said substrate and below said first type gate trenches and said second type gate trench.

11. The trenched semiconductor power device of claim 10, wherein said epitaxial layer comprises a single epitaxial layer having uniform doping concentration.

12. The trenched semiconductor power device of claim 10, wherein said epitaxial layer comprises a lower epitaxial layer with resistivity R1 and an upper epitaxial layer with resistivity R2, wherein R1>R2.

13. The trenched semiconductor power device of claim 10, wherein said epitaxial layer comprises a lower epitaxial layer with resistivity R1 and an upper epitaxial layer with resistivity R2, wherein R1<R2.

14. The integrated circuit of claim 10, wherein with each of said first type trenches, said shielded electrode is disposed in a lower portion and said first gate electrode is disposed in an upper portion, said shielded electrode and said first gate electrode are insulated from each other by a second insulating film; with said second type trench, said shielded electrode is disposed in a lower portion and said second gate electrode is disposed in an upper portion, said shielded electrode and said second gate electrode are insulated from each other by said second insulating film.

15. The integrated circuit of claim 14, wherein said first insulating film is a single oxide film having uniform thickness.

16. The integrated circuit of claim 14, wherein said first insulating film has multiple stepped oxide structure having greatest thickness along bottom of said first and second type trenches.

17. The integrated circuit of claim 10, wherein within each of said first type trenches, said shielded electrode is disposed in the middle and said first gate electrode is disposed surrounding an upper portion of said shielded electrode, said shielded electrode and said first gate electrode are insulated from each other by said first gate oxide film; within said second type trench, said shielded electrode is disposed in the middle and said second gate electrode is disposed surrounding an upper portion of said shielded electrode, said shielded electrode and said second gate electrode are insulated from each other by said second gate oxide film.

18. The integrated circuit of claim 17, wherein said second type trench has a trench width and a trench depth same as said first type trenches.

19. The integrated circuit of claim 17, wherein said second type trench has a trench width and a trench depth greater than said first type trenches.

20. The integrated circuit of claim 1, wherein said short channel implant region is formed by an angle implant of Arsenic or Phosphorus through a short channel implant mask after removing said first gate oxide and before growing said second gate oxide.

* * * * *